(12) United States Patent
Kim

(10) Patent No.: US 12,095,302 B2
(45) Date of Patent: Sep. 17, 2024

(54) VEHICLE AND METHOD OF RELEASING FUSION OF SWITCHING DEVICE DURING CHARGING OF VEHICLE BATTERY

(71) Applicants: Hyundai Motor Company, Seoul (KR); Kia Corporation, Seoul (KR)

(72) Inventor: Yonghyun Kim, Gyeonggi-do (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 352 days.

(21) Appl. No.: 17/578,067

(22) Filed: Jan. 18, 2022

(65) Prior Publication Data

US 2023/0087317 A1    Mar. 23, 2023

(30) Foreign Application Priority Data

Sep. 23, 2021   (KR) .................. 10-2021-0125678

(51) Int. Cl.
*H02J 7/00* (2006.01)
*B62D 5/04* (2006.01)
*G01R 19/10* (2006.01)
*G07C 5/08* (2006.01)

(52) U.S. Cl.
CPC ........ *H02J 7/00712* (2020.01); *B62D 5/0481* (2013.01); *G01R 19/10* (2013.01); *G07C 5/0816* (2013.01)

(58) Field of Classification Search
CPC ........ B60L 53/11; B60L 53/24; B62D 5/0481; G01R 19/10; G01R 31/3278; G07C 5/0816; H02J 7/00712; H02J 7/14; Y02T 10/70
See application file for complete search history.

(56) References Cited

U.S. PATENT DOCUMENTS

2013/0314012 A1* 11/2013 Cho .................. B60L 3/003
                                                    318/400.21
2017/0136913 A1*  5/2017 Yang ................ B60L 58/20

FOREIGN PATENT DOCUMENTS

KR        2019-0040120 A      4/2019

* cited by examiner

Primary Examiner — Charles J Han
(74) Attorney, Agent, or Firm — Fox Rothschild LLP

(57) ABSTRACT

A vehicle includes a battery, a motor supplied with an input voltage, an inverter configured to boost the input voltage supplied to the motor to output to the battery, a voltage measuring device configured to measure the input voltage, a switching device connected to a neutral point of the motor, and a controller that determines whether fusion of the switching device occurs, repeats on/off of the switching device based on the determination result, measures a first voltage applied to the voltage measuring device, measures a second voltage applied to the voltage measuring device after discharging the voltage measuring device, compares the first voltage with the second voltage, and charges the battery when the fusion of the switching device is released based on the comparison result.

14 Claims, 6 Drawing Sheets

VEHICLE AND METHOD OF RELEASING FUSION OF SWITCHING DEVICE DURING CHARGING OF VEHICLE BATTERY

CROSS-REFERENCE TO RELATED APPLICATION(S)

This application claims under 35 U.S.C. § 119 the benefit of Korean Patent Application No. 10-2021-0125678, filed on Sep. 23, 2021, the entire contents of which are incorporated herein by reference.

BACKGROUND

(a) Technical Field

The disclosure relates to a vehicle and a method of controlling the same, more particularly, to the vehicle capable of multi charging a vehicle battery using a device provided in the vehicle and a method of releasing fusion of a switching device during charging of the vehicle battery.

(b) Description of the Related Art

Generally, a fast charging method based on multi charging has been used to charge a battery. A multi charging is a method of rapidly charge a battery by boosting a low voltage charging voltage using vehicle components.

To use such a multi charging method, a relay for multi fast charging is required. However, safety issues may result if fusion of the multi fast charging relays occurs. In this case, a conventional charging device blocks charging when multi fast charging relays are fused. Accordingly, a study for forcibly releasing the fusion of the multi fast charging relays and continuously maintaining the charge of a battery has been required.

SUMMARY

The disclosure provides a vehicle capable of forcibly releasing fusion occurrence of a relay during multi charging and a method of controlling the same.

Furthermore, the disclosure provides a boost converter capable of multi charging based on the operation of a relay.

Additional aspects of the disclosure will be set forth in part in the description which follows and, in part, will be obvious from the description, or may be learned by practice of the disclosure.

In accordance with an aspect of the disclosure, a vehicle includes a battery; a motor supplied with an input voltage; an inverter configured to boost the input voltage supplied to the motor to output to the battery; a voltage measuring device configured to measure the input voltage; a switching device connected to a neutral point of the motor; and a controller including determining whether fusion of the switching device occurs, repeating on/off of the switching device based on the determination result, measuring a first voltage applied to the voltage measuring device, measuring a second voltage applied to the voltage measuring device after discharging the voltage measuring device, comparing the first voltage with the second voltage, and charging the battery when the fusion of the switching device is released based on the comparison result.

The controller may repeat the on/off of the switching device based on a predetermined number of times in response to determining that the fusion of the switching device is sustained.

The controller may repeat the on/off of the switching device based on the predetermined number of times in response to determining that the vehicle is started and a charging port of the vehicle is closed.

The vehicle may further include a display device displaying fusion information of the switching device, wherein the controller displays a failure of the switching device on the display device when the fusion of the switching device occurs.

The controller may include an inverter, and forcibly discharging the voltage measuring device by switching of the inverter.

The controller may boost a voltage based on the switching of the inverter.

The controller may store a voltage applied to the switching device.

In accordance with another aspect of the disclosure, a method of controlling a vehicle, the method includes the steps of measuring a voltage applied to a switching device; and controlling to determine whether fusion of the switching device occurs, repeat on/off of the switching device based on the determination result, determine a first voltage applied to the switching device, determine a second voltage applied to the switching device after discharging a voltage measuring device, compare the first voltage with the second voltage, and determine whether to charge a battery based on the comparison result.

The step of controlling may include repeating the on/off of the switching device based on a predetermined number of times in response to determining that the fusion of the switching device is sustained.

The step of controlling may include repeating the on/off of the switching device based on the predetermined number of times in response to determining that the vehicle is started and a charging port of the vehicle is closed.

The method may further include a step of displaying fusion information of the switching device, wherein the step of controlling comprises displaying a failure of the switching device when the switching device is fused.

The step of controlling may further include switching an inverter, and forcibly discharging the voltage measuring device by switching of the inverter.

The step of controlling may include boosting a voltage based on the switching of the inverter.

The step of controlling may include storing a voltage applied to the switching device.

BRIEF DESCRIPTION OF THE DRAWINGS

These and/or other aspects of the disclosure will become apparent and more readily appreciated from the following description of the exemplary embodiments, taken in conjunction with the accompanying drawings, of which.

DETAILED DESCRIPTION

Figure 1:
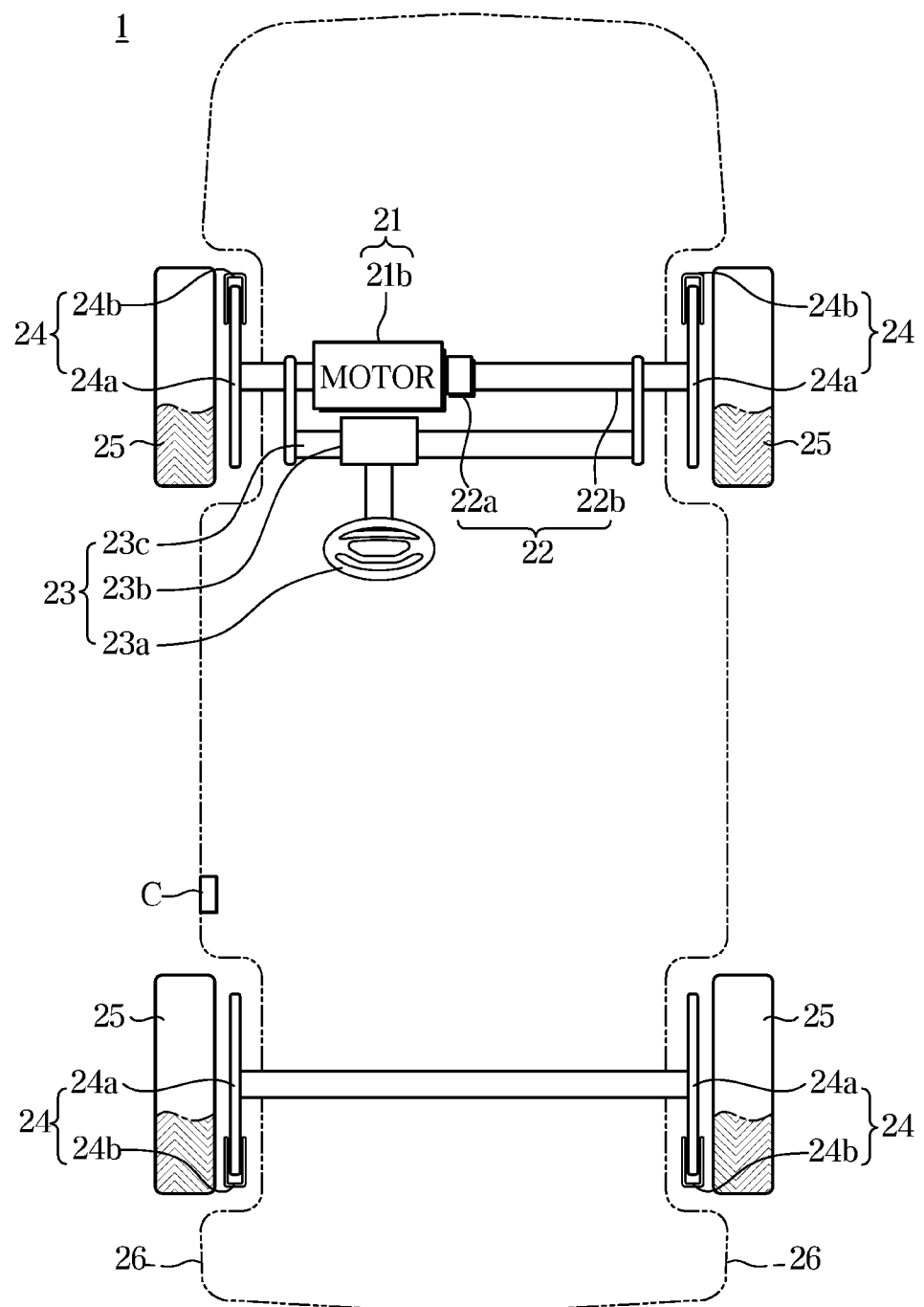
FIG. 1 is a view showing a vehicle according to an embodiment of the disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles. The terminology used herein is for the purpose of describing particular embodiments only and is not intended to be limiting of the disclosure.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Like reference numerals refer to like elements throughout. The disclosure does not describe all elements of the embodiments, and overlaps between the general contents or the embodiments in the technical field to which the disclosure belongs. This specification does not describe all elements of the exemplary embodiments of the disclosure and detailed descriptions on what are well known in the art or redundant descriptions on substantially the same configurations may be omitted. The term 'part, module, member, block' used in the specification may be implemented in software or hardware, and a plurality of 'part, module, member, block' may be embodied as one component, It is also possible that one 'part, module, member, block' includes a plurality of components.

Throughout the specification, when an element is referred to as being "connected to" another element, it may be directly or indirectly connected to the other element and the "indirectly connected to" includes being connected to the other element via a wireless communication network.

Throughout the specification, when a member is located "on" another member, this includes not only when one member is in contact with another member but also when another member exists between the two members.

The terms first, second, etc. are used to distinguish one component from another component, and the component is not limited by the terms described above.

Singular expressions include plural expressions unless the context clearly indicates an exception.

In each step, the identification code is used for convenience of description, and the identification code does not describe the order of each step. Each of the steps may be performed out of the stated order unless the context clearly dictates the specific order.

Hereinafter, with reference to the accompanying drawings will be described the working principle and embodiments of the disclosure.

A vehicle using a motor is typically referred to as an electric vehicle (EV), converts electric energy stored in a battery into rotational kinetic energy, and may move with the converted rotational force. A vehicle using a motor may receive power from outside.

Some vehicles use both an engine and a motor. These are referred to as a Hybrid Electric Vehicle (HEV) and may be moved using the engine as well as the motor. The HEV may be divided into a general HEV that receives only fossil fuel from the outside and generates electric energy using the engine and the motor (generator), and a plug-in Hybrid Electric Vehicle (PHEV) that receives both fossil fuel and electric energy from the outside.

The EV and the HEV generally include a charger for supplying electric energy to a driving motor and a low voltage battery for supplying electric energy to an electric device (also referred to as an electrical device) component of the vehicle, respectively. Herein, the charger may be a high voltage battery.

For example, the charger that supplies electrical energy to the drive motor may have an output voltage of approximately several hundred volts V (e.g., 300 V~400 V), and the low voltage battery that supplies electrical energy to the electric components may have an output voltage of approximately several tens of volts (e.g., 12 V).

The EV and the HEV may charge their chargers while driving. The drive motor may convert electrical energy into kinetic energy (rotational force), as well as convert kinetic energy (rotational force) into electrical energy. In other words, the driving motor may function as a motor when electric energy is supplied from the outside, and may function as a generator to which kinetic energy is supplied from the outside. When the vehicle travels downhill or decelerates (regenerative braking) due to the operation of the driving motor, the driving motor may generate electric power, and the charger may be charged using the electric power generated by the driving motor (charging by regenerative braking).

Furthermore, the EV and the HEV, particularly the HEV, may charge their batteries with a high voltage from an external power source (e.g., a direct current (DC) power or an alternating current (AC) power) while parking. For example, the charger of the vehicle may be charged using commercial DC power at a charging station or be charged using household AC power at home.

As such, a separate control circuit is required to charge the charger from the external power source. A vehicle according to an embodiment of the disclosure is intended to eliminate or minimize the separate control circuit.

FIG. 1 is a view illustrating a vehicle according to an embodiment of the disclosure.

As shown in FIG. 1, a vehicle 1 includes a power generator 21, a power transmitter 22, a steering device 23, a braking device 24, and wheels 25.

The power transmitter 22, the steering device 23, the braking device 24 and the wheels 25 may be the same as those shown in FIG. 1. On the other hand, the power generator 21 includes a motor 21b and a motor inverter battery C.

The vehicle 1 may include the motor 21b and the motor inverter battery C.

As described above, the vehicle 1 according to the embodiment basically includes the motor 21b and the motor inverter battery C.

Hereinafter, the motor 21b and the motor inverter battery C of the vehicle 1 will be described in more detail.

Figure 2:
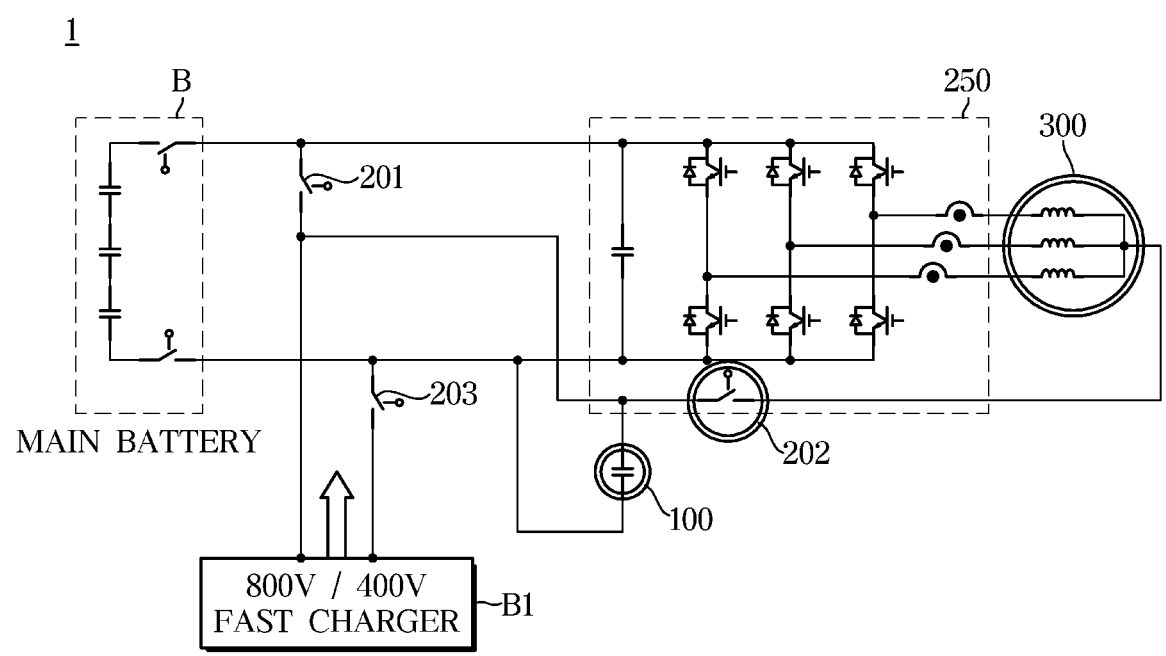
FIG. 2 is a view showing a control circuit of a vehicle according to an embodiment of the disclosure.

FIG. 2 is a view illustrating the motor inverter battery C of the vehicle 1 according to an embodiment of the disclosure.

The motor inverter battery C includes a main battery B, a voltage measuring device 100, a switching device 200 (not shown), a motor 300, and an inverter 250.

Herein, the main battery B is a battery having a lower voltage than that of a fast charger (not shown). Furthermore, the fast charger may be a high voltage battery compared to the main battery B, specifically, the fast charger may be a high voltage battery having a range of 400~800 V.

The voltage measuring device 100 may include a capacitor, and the switching device 200 may include a relay. Furthermore, the motor may include at least three coils, and the discharge circuit 250 may include a plurality of insulated-gate bipolar transistors (IGBT). Hereinafter, the configuration of the vehicle and the motor inverter battery C included in the vehicle according to the disclosure will be described in detail.

The switching device 200 may include a first switch 201, a second switch 202, and a third switch 203. The first and second switches 201 and 203 connect the fast charger and the main battery B, transmit an input voltage to the motor 300, and transmit an output voltage to the main battery B when the input voltage is boosted to the output voltage by the motor 300, and the second switch 202 is connected to a neutral point of the motor 300 to transmit the input voltage to the motor 300 so as to boost the input voltage.

As such, the vehicle 1 according to the embodiment may boost the voltage for charging by using the motor 300 as a converter. In other words, the vehicle 1 may support multi charging in which the main battery B is rapidly charged by boosting the low voltage using the motor 300. In general, multi charging is a fast charging method that may be charged with all different types of chargers, for example, a voltage of 400 V/800 V may be used together. Specifically, in the multi charging method, the battery is directly charged when connected to a 800 V charger, and the battery is charged by boosting the voltage of 400 V to 800 V through a combination of the inverter 250 and the motor 300 when connected to a 400 V charger.

Figure 3:
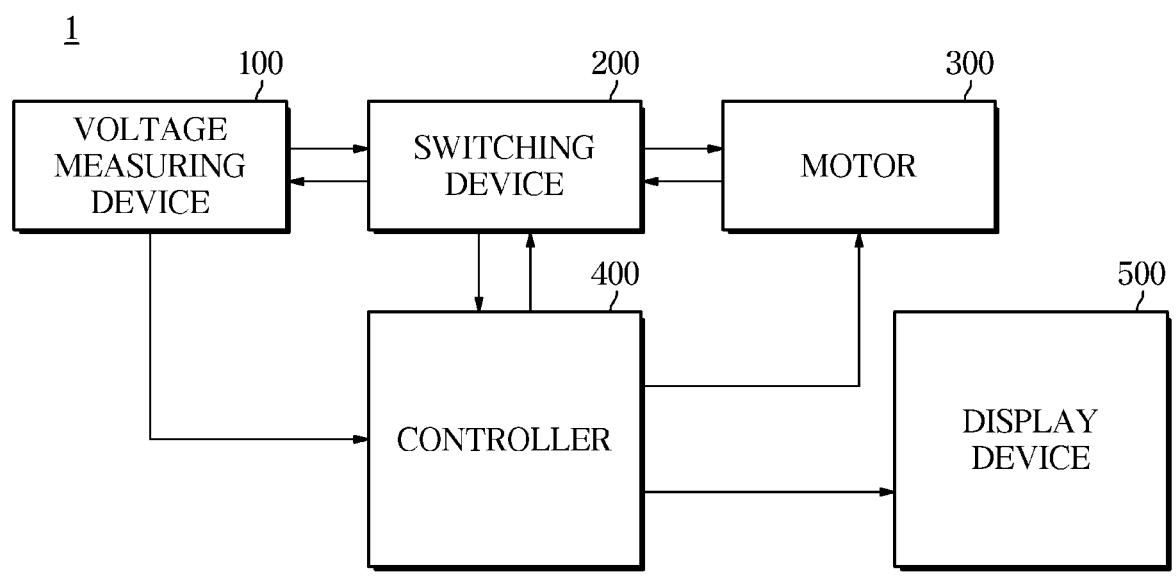
FIG. 3 is a control block diagram showing a vehicle according to an exemplary embodiment of the disclosure.

FIG. 3 is a control block diagram illustrating according to an exemplary embodiment of the disclosure.

The vehicle 1 according to an exemplary embodiment of the disclosure may include the voltage measuring device 100, the switching device 200, the motor 300, and a controller 400, and a display device 500.

The voltage measuring device 100 according to the exemplary embodiment of the disclosure is provided between the fast charger and the neutral point of the motor 300, and measures the voltage applied to the neutral point of the motor 300. Specifically, the voltage measuring device 100 may include a capacitor and be connected in parallel with the switching device 200. Furthermore, the voltage measuring device 100 may store a certain amount of electric charge, and may be discharged in response to the operation of the inverter 250.

The switching device 200 according to the exemplary embodiment of the disclosure may include a relay, and receive excitation signals of the relay and repeat on/off of the relay. Herein, the on/off of the relay may be repeated a predetermined number of times. The number of on/off repetitions of the relay may vary based on a charging time or a charging amount of the battery B, but is not limited thereto. Furthermore, the number of on/off repetitions of the relay may vary according to a user's definition.

The motor 300 according to the exemplary embodiment of the disclosure may include three coils enable of representing three phases in general. In addition, the motor 300 may have the neutral point at a contact point to which three coils are connected.

Furthermore, as described above, the motor 300 may function as a motor when electric energy is supplied from the outside, and function as a generator to which kinetic energy is supplied from the outside. When the vehicle travels downhill or decelerates (regenerative braking) due to the operation of the motor 300, the motor 300 may generate electric power, and the charger may be charged using the electric power generated by the motor 300 (charging by regenerative braking).

The controller 400 according to an exemplary embodiment of the disclosure determines whether the fusion of the switching device 200 occurs or not, repeats the on/off of the switching device 200 based on the determination result, determines a first voltage applied to the switching device 200, determines a second voltage applied to the switching device 200 after discharging the voltage measuring device 100, compares the first voltage with the second voltage, and determines whether charging the battery based on the comparison result.

Herein, the first voltage refers to a voltage applied to the switching device 200 before a forced discharge of the inverter 250 is performed, and the second voltage refers to a voltage applied to the switching device 200 after the forced discharge of the inverter 250 is performed. Furthermore, the first voltage and the second voltage may be a maximum (Cap) value of the voltage waveform, but is not limited thereto.

Furthermore, the controller 400 may control the switching device 200 to repeat on/off the predetermined number of times in order to release the fusion of the switching device 200.

In particular, when it is determined that the fusion of the switching device 200 has been sustained, the controller 400 may repeat the on/off of the switching device 200 based on the predetermined number of times. In addition, when it is determined that the vehicle 1 is started and a charging port of the vehicle 1 is closed, the controller 400 may repeat the on/off of the switching device 200 based on the predetermined number of times.

Herein, the predetermined number of times may refer to the number of times required for releasing the fusion of the switching device 200, but is not limited thereto and may vary according to a user's definition.

Furthermore, the controller 400 may determine whether the switching device 200 is fused or not, and control the display device 500 to display the determined fusion information of the switching device 200 or failure information of the switching device 200.

Furthermore, the controller 400 may include the inverter 250, and the inverter 250 may include a plurality of IGBTs.

The controller 400 may control the inverter 250 to repeat switching, and may discharge forcibly the voltage measuring device 100.

Furthermore, the inverter 250 may be a boost circuit. Accordingly, when the inverter 250 repeats the switching, the output voltage of the inverter 250 represents an increased value compared to the input voltage.

In particular, if the voltage applied to the voltage measuring device 100 is 400 V, the output voltage of the inverter 250 may be 800 V, but is not limited thereto.

Furthermore, the controller 400 may store or memory the voltage measured by the voltage measuring device 100.

The display device 500 according to an exemplary embodiment of the disclosure displays whether the switching device 200 is fused or not or failure or not.

The display device 500 may be provided as a cathode ray tube (CRT), a digital light processing panel (DLP), a plasma display panel (PDP), a liquid crystal display (LCD) panel, an electroluminescence (EL) panel, a Electrophoretic Display (EPD) panel, a Electrochromic Display (ECD) panel, a Light Emitting Diode (LED) panel, or an Organic Light Emitting Diode (OLED) panel, and the like, but is not limited thereto. Furthermore, the display device 500 may be a cluster provided in the vehicle 1, a navigation system, or a user terminal interworked with the vehicle 1.

At least one component may be added or deleted according to the performance of the components of the vehicle 1 shown in FIG. 3. Furthermore, it will be readily understood by a person skilled in the art that mutual positions of the components may be changed corresponding to the performance or structure of the system.

On the other hand, each component shown in FIG. 3 may refers to a hardware component such as software and/or a Field Programmable Gate Array (FPGA) and an Application Specific Integrated Circuit (ASIC).

Hereinafter, a process in which the controller 400 controls the vehicle 1 according to an exemplary embodiment of the disclosure will be described.

Figure 4:
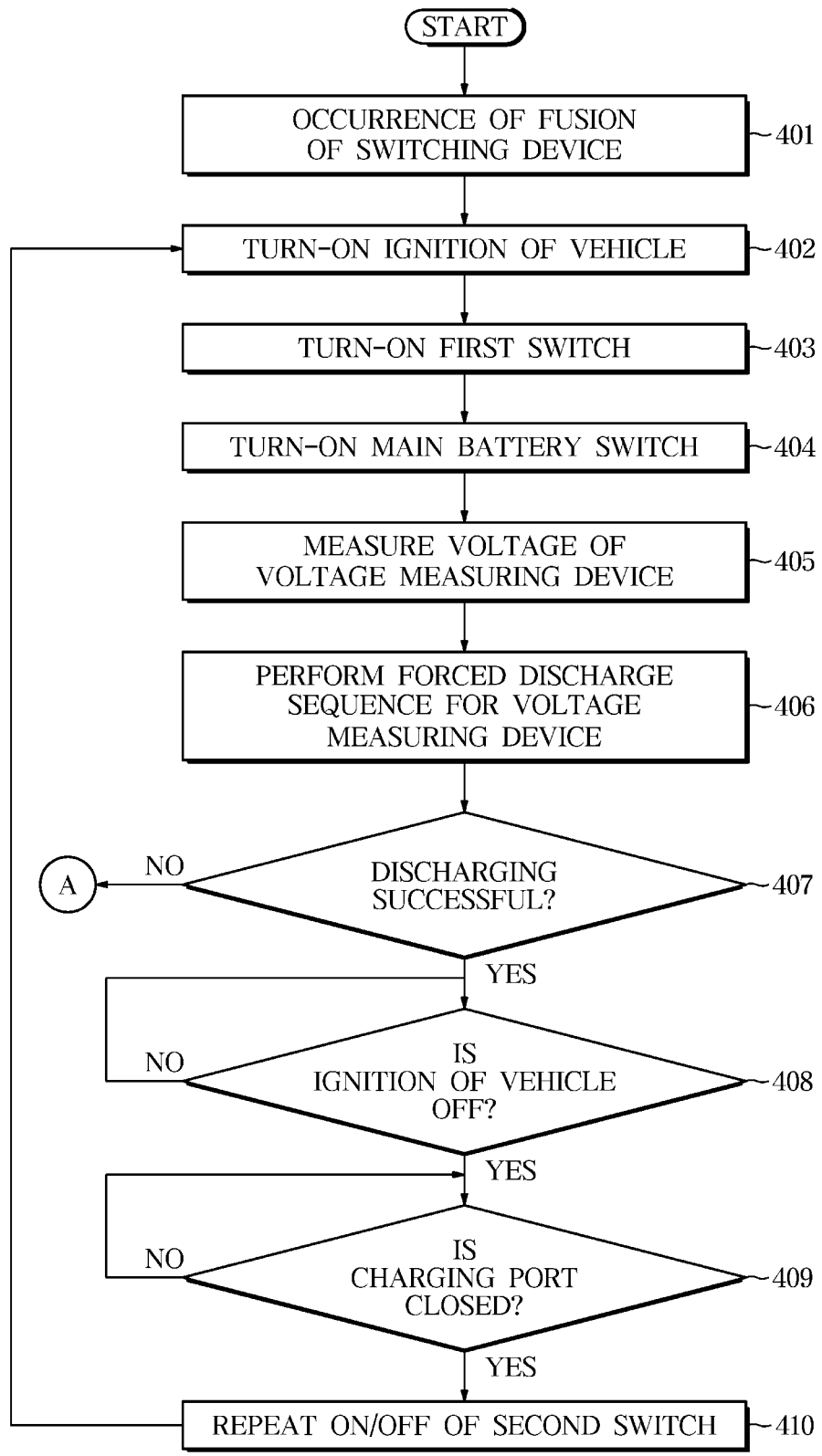
FIGS. 4 and 5 are flowcharts showing a method of controlling a vehicle according to an exemplary embodiment of the disclosure.
Figure 5:
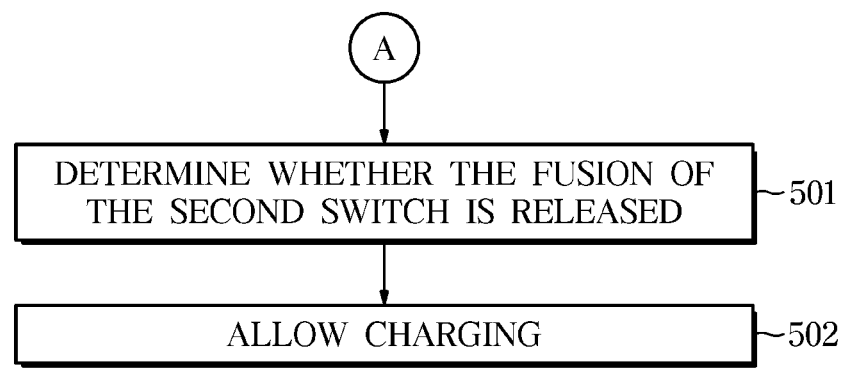

FIGS. 4 and 5 are flowcharts showing a method of controlling the vehicle 1 according to an exemplary embodiment of the disclosure.

The controller 400 determines whether the fusion of the switching device occurs or not (401). At this time, the switching device corresponds to the second switch 202 that connected to the neutral point of the motor 300 to transmit the input voltage to the motor 300 so as to boost the input voltage. The controller performs following control processes to release the fusion to the second switch 202.

The controller 400 determines whether an ignition (IG) of the vehicle is on based on a IG switch of the vehicle 1 (402), controls the first switch 201 to be in a on state (403), and controls a main battery switch to be in a on state (404).

According to an exemplary embodiment, in response to determining that the IG of vehicle 1 is on, the controller 400 may control the switching device 200 to repeat the on/off of the switching device 200. Specifically, the controller 400 generates excitation signals to force the switching device 200 to repeat on/off. Furthermore, the switching device 200 may repeat on/off for the predetermined number of times determined depending on at least one of a user's definition, a charging speed of the battery B, or a charging amount of the battery B.

The controller 400 measures the voltage of the voltage measuring device 100 (405). The voltage measuring device 100 may include a capacitor and store electric charges. Furthermore, the controller 400 may determine a voltage applied to the voltage measuring device 100 and determine whether the voltage measuring device 100 is discharged or not. According to an exemplary embodiment, the controller 400 may measure the voltage of the voltage measuring device 100 while repeating the on/off of the switching device 200.

To determine again whether the fusion of the second switch occurs or not, the controller 400 performs a forced discharge sequence for the voltage measuring device 100 (406), and determines whether discharging of the voltage measuring device 100 is successful (407). The forced discharge sequence is achieved through switching of the inverter 250. As described above, the inverter 250 includes the plurality of IGBTs, and the controller 400 may generate the output voltage greater than the input voltage through the switching of the inverter 250. At this time, when discharging is performed due to the occurrence of the voltage drop of the capacitor, the controller 400 may determine that the fusion of the second switch 202 has been sustained. Conversely, if the voltage drop of the capacitor does not occur, the controller 400 may determine that the fusion of the second switch 202 is released.

If it is determined that the fusion of the second switch 202 has been sustained, the controller 400 may control the second switch 202 to repeat on/off in order to forcibly release the fusion to the second switch 202 (410). At this time, additionally, when it is determined that the IG of the vehicle is off (408) and the charging port of the vehicle 1 is closed (409), the controller 400 may generates excitation signals to the second switch 202 and control the second switch 202 to repeat on/off thereof.

According to an exemplary embodiment, the controller 400 determines whether the fusion of the switching device 200 occurs or not, and releases the fusion by repeating the turn-on/off of the switching device 200 in response to determining that the switching device 200 is fused. At this time, the controller 400 measures the first voltage applied to the voltage measuring device 100, and after discharging is performed by the forced discharge sequence, measures the second voltage of the voltage measuring device 100. If the difference between the first voltage and the second voltage is greater than or equal to a predetermined value, it is determined that the fusion of the switching device 200 has been sustained by being performed discharging, and if the difference between the first voltage and the second voltage is less than the predetermined value, it is determined that the fusion of the switching device 200 has been sustained. At this time, if it is determined that the fusion of the switching device 200 is released, the controller 400 determines whether charging is possible and then performs the rapid charging process.

Referring to FIG. 5, the controller 400 may determine whether the fusion of the second switch is released (501) by detecting that the voltage drop of the capacitor doing not occurred.

If the fusion of the second switch 200 is released, the controller 400 allows the battery B to be charged (502). In addition, the controller 400 may release a failure information guidance displayed on the cluster of the vehicle 1 and allow rapid charging.

Figure 6:
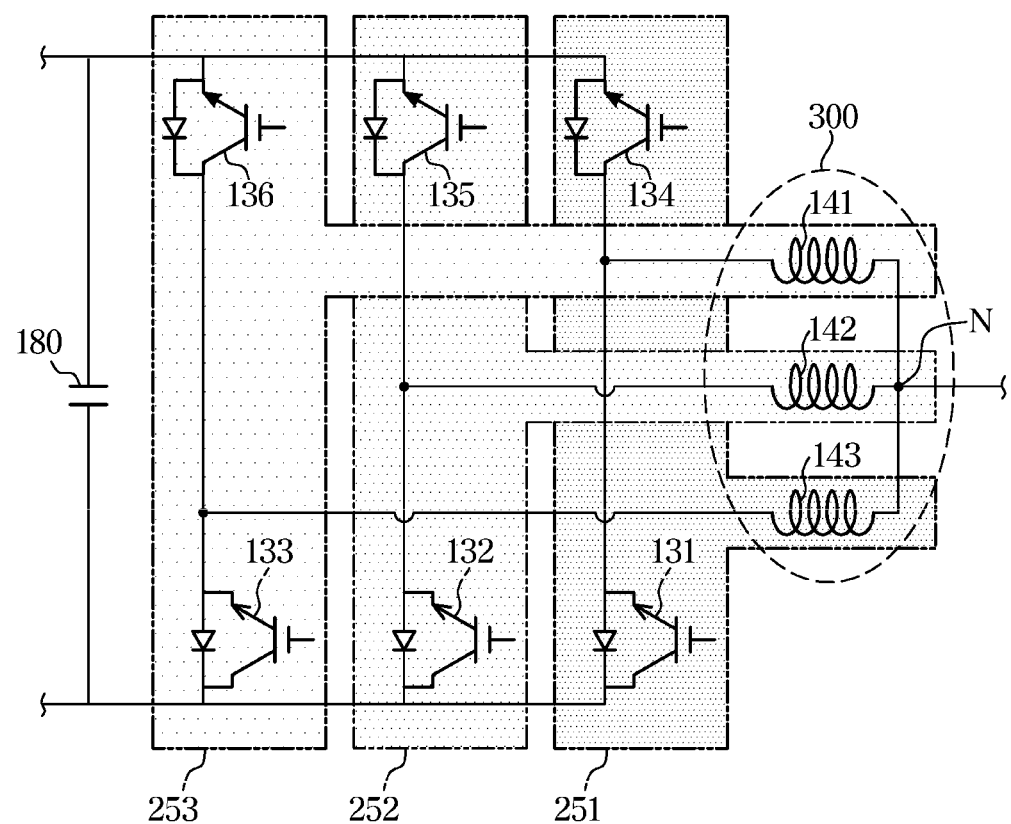
FIG. 6 is a view showing a boost converter included in an inverter according to an exemplary embodiment of the disclosure.

FIG. 6 is a view illustrating a boost converter included in the inverter 250 according to an exemplary embodiment of the disclosure.

Referring to FIG. 6, abc-phases coils 141, 142 and 143 and freewheeling diodes of upper driving switches 131-136 and lower driving switches 131-136 may form the inverter 250.

In particular, the a-phase coil 141, the first upper driving switch 131, and the first lower driving switch 134 may form a first power factor corrector 251, and the b-phase coil 142, the second upper driving switch 132, and the second lower driving switch 135 may form a second power factor corrector 252, and the c-phase coil 143, the third upper driving switch 133, and the third lower driving switch 136 may form the third power factor corrector 253. As such, the motor 140 and the inverter 130 may form the inverter 250 including a three-phase interleave.

The lower driving switches 131-136 repeat turn-on and turn-off, and by repeating the turn-on and turn-off of the lower driving switches 131-136, the inverter 250 may output a current having the same phase as the AC voltage of external power source (ES) to a DC link capacitor 180. The DC link capacitor 180 may be charged by the output current of the inverter 250.

As a result, the electric energy of the ES may be transmitted to the DC link capacitor 180 through the motor 300 and the inverter.

Power from the ES may be supplied to a high voltage battery 110 through the motor 300, the inverter, the DC link capacitor 180, a booster converter 120, a three-winding transformer 230, and a full-bridge circuit 210. In particular, the motor 300 may receive an input voltage from the external power source, the inverter may boost the input voltage supplied to the motor to output the boosted voltage to the battery.

Through the above described operation of the inverter 250, the voltage measuring device 100 may be discharged, the controller 400 may determine whether the fusion of the switching device 200 is released or not, and the inverter 250 may output the output voltage higher than that of the input voltage.

As is apparent from the above, according to the exemplary embodiments of the disclosure may provide a vehicle capable of forcibly releasing the fusion occurrence of the relay during multi charging and a method of controlling the same.

Furthermore, the vehicle and the method of controlling the same according to the exemplary embodiments of the disclosure, by releasing the fusion of the relay, may increase the user's convenience in charging the battery and reduce the replacement cost when a failure of the relay occurs.

Meanwhile, the exemplary embodiments of the disclosure may be embodied in the form of a recording medium storing instructions executable by a computer. The instructions may be stored in the form of program code and, when executed by a processor, may generate a program module to perform the operations of the exemplary embodiments. The recording medium may be embodied as a non-transitory computer-readable recording medium.

The non-transitory computer-readable recording medium includes all types of recording media in which instructions which may be decoded by a computer are stored, for example, a Read Only Memory (ROM), a Random Access Memory (RAM), a magnetic tape, a magnetic disk, a flash memory, an optical data storage device, and the like.

Although exemplary embodiments of the disclosure have been described for illustrative purposes, those skilled in the art will appreciate that various modifications, additions and substitutions are possible, without departing from the scope and spirit of the disclosure. Therefore, exemplary embodiments of the present disclosure have not been described for limiting purposes.

What is claimed is:

1. A vehicle, comprising:
a battery;
a motor supplied with an input voltage;
an inverter configured to boost the input voltage supplied to the motor and to output boosted voltage to the battery;
a voltage measuring device configured to measure the input voltage supplied to the motor;
a switching device connected to a neutral point of the motor; and
a processor configured to:
determine whether fusion of the switching device occurs;
toggle the switching device on and/or off so that the fusion of the switching device is released when it is determined that the fusion of the switching device has occurred;
obtain a first voltage supplied to the voltage measuring device;
after obtaining the first voltage, discharge the voltage measuring device;
obtain a second voltage supplied to the voltage measuring device after the discharging;
compare the first voltage to the second voltage;
determine that the fusion of the switching device is released when a difference between the first voltage and the second voltage is greater than a predetermined value; and
charge the battery when is determined that the fusion of the switching device is released.

2. The vehicle of claim 1, wherein the controller toggles the switching device on and/or off for a predetermined number of times in response to determining that the fusion of the switching device is sustained.

3. The vehicle of claim 2, wherein the controller toggles the switching device on and/or off response to determining that the vehicle is started and a charging port of the vehicle is closed.

4. The vehicle of claim 1, further comprising a display configured to display fusion information of the switching device, wherein the controller displays a failure of the switching device when the fusion of the switching device occurs.

5. The vehicle of claim 1, wherein the controller comprises an inverter, and forcibly discharging the voltage measuring device by switching of the inverter.

6. The vehicle of claim 5, wherein the controller boosts a voltage based on the switching of the inverter.

7. The vehicle of claim 1, wherein the controller stores a value of the voltage applied to the switching device.

8. A method of controlling a vehicle, the method comprising the steps of:
measuring, by a voltage measuring device, a voltage applied to a switching device connected to a neutral point of a motor; and
determining whether fusion of the switching device occurs;
toggling the switching device on and/or off so that the fusion of the switching device is released when it is determined that the fusion of the switching device has occurred;
obtaining a first voltage supplied to the voltage measuring device;
after obtaining the first voltage, discharge the voltage measuring device, obtaining a second voltage supplied to the voltage measuring device after the discharging;

comparing the first voltage to the second voltage;

determining that the fusion of the switching device is released when a difference between the first voltage and the second voltage is greater than a predetermined value; and charging the battery when is determined that the fusion of the switching device is released.

9. The method of claim 8, wherein the step of controlling comprises toggling the switching device on and/or off for a predetermined number of times in response to determining that the fusion of the switching device is sustained.

10. The method of claim 9, wherein the step of controlling comprises toggling the switching device on and/or off in response to determining that the vehicle is started and a charging port of the vehicle is closed.

11. The method of claim 8, further comprising a step of displaying fusion information of the switching device, wherein the step of controlling comprises displaying a failure of the switching device when the switching device is fused.

12. The method of claim 8, wherein the step of controlling further comprises switching an inverter, and forcibly discharging the voltage measuring device by switching of the inverter.

13. The method of claim 12, wherein the step of controlling comprises boosting a voltage based on the switching of the inverter.

14. The method of claim 8, wherein the step of controlling comprises storing a value of the voltage applied to the switching device.

* * * * *